US010411422B1

(12) United States Patent
Hirota et al.

(10) Patent No.: US 10,411,422 B1
(45) Date of Patent: Sep. 10, 2019

(54) SEMICONDUCTOR MEMORY DEVICE

(71) Applicant: Toshiba Memory Corporation, Minato-ku (JP)

(72) Inventors: Akinobu Hirota, Yokohama (JP); Shiro Harashima, Sagamihara (JP)

(73) Assignee: Toshiba Memory Corporation, Minato-ku (JP)

( * ) Notice: Subject to any disclaimer, the term of this patent is extended or adjusted under 35 U.S.C. 154(b) by 0 days.

(21) Appl. No.: 16/125,999

(22) Filed: Sep. 10, 2018

(30) Foreign Application Priority Data

Mar. 15, 2018 (JP) ................................. 2018-048146

(51) Int. Cl.
| | |
|---|---|
| *H01R 27/00* | (2006.01) |
| *H05K 5/00* | (2006.01) |
| *H05K 1/18* | (2006.01) |
| *H05K 5/04* | (2006.01) |
| *H01R 12/71* | (2011.01) |
| *H01R 13/502* | (2006.01) |
| *H05K 5/02* | (2006.01) |

(52) U.S. Cl.
CPC ........... *H01R 27/00* (2013.01); *H01R 12/716* (2013.01); *H01R 13/5025* (2013.01); *H05K 1/181* (2013.01); *H05K 5/0026* (2013.01); *H05K 5/0247* (2013.01); *H05K 5/04* (2013.01); *H05K 2201/10159* (2013.01); *H05K 2201/10522* (2013.01)

(58) Field of Classification Search
CPC ............... H05K 5/0026; H05K 5/0278; G06K 19/07732; H01R 27/00
See application file for complete search history.

(56) References Cited

U.S. PATENT DOCUMENTS

| | | | | |
|---|---|---|---|---|
| 6,456,500 B1* | 9/2002 | Chen | .................... | H05K 5/0278 361/736 |
| 7,035,110 B1* | 4/2006 | Wang | .................... | H05K 5/0278 361/737 |
| 7,095,617 B1* | 8/2006 | Ni | ......................... | H05K 5/0278 361/736 |
| 7,223,574 B2* | 5/2007 | Lei | ......................... | H01R 13/44 435/135 |
| 7,307,849 B2* | 12/2007 | Ho | ..................... | H01R 13/4538 361/737 |
| 7,359,208 B2* | 4/2008 | Ni | .......................... | G11B 33/12 174/50.51 |
| 7,422,454 B1* | 9/2008 | Tang | ................... | H01R 13/6658 439/131 |
| 7,524,198 B2* | 4/2009 | Nguyen | .............. | G06F 12/1416 439/131 |
| 7,535,719 B2* | 5/2009 | Hiew | .................... | H01L 21/565 361/715 |

(Continued)

*Primary Examiner* — Ross N Gushi

(74) *Attorney, Agent, or Firm* — Oblon, McClelland, Maier & Neustadt, L.L.P.

(57) ABSTRACT

According to one embodiment, a semiconductor memory device includes a casing, a substrate, a second connector, and an interposition member. The casing is provided with a first opening and includes a first edge forming the first opening. A first connector conforms to USB Type-A standard and can pass through the first opening. The interposition member is interposed between an inner surface of the casing and the second connector, is held by the inner surface, and holds the second connector.

18 Claims, 7 Drawing Sheets

(56) References Cited

U.S. PATENT DOCUMENTS

| | | | | |
|---|---|---|---|---|
| 7,547,218 | B2 * | 6/2009 | Hiew | H01R 13/6395 439/135 |
| 7,581,967 | B2 * | 9/2009 | Collantes, Jr. | H01R 13/6485 439/131 |
| 7,661,967 | B2 * | 2/2010 | Tang | H01R 13/6658 439/131 |
| 7,771,215 | B1 * | 8/2010 | Ni | G06K 19/07732 439/131 |
| 7,959,448 | B1 * | 6/2011 | Chou | G06K 19/07 439/131 |
| 8,043,099 | B1 * | 10/2011 | Ni | H05K 5/0278 439/131 |
| 8,081,483 | B2 * | 12/2011 | Huang | G06K 19/077 361/752 |
| 8,089,751 | B2 * | 1/2012 | Lo | H05K 5/0278 361/679.31 |
| 8,120,903 | B2 * | 2/2012 | Lin | H01R 12/721 361/679.4 |
| 8,179,669 | B2 * | 5/2012 | Huang | G06K 19/077 361/679.31 |
| 8,192,211 | B1 * | 6/2012 | Huang | H01R 13/447 439/131 |
| 8,446,731 | B2 * | 5/2013 | Lin | H05K 5/0278 361/752 |
| 8,500,466 | B2 * | 8/2013 | Zhang | G06K 19/07732 439/131 |
| 8,625,270 | B2 * | 1/2014 | Ni | G06F 21/32 361/679.02 |
| 8,670,243 | B2 * | 3/2014 | Mitsuhashi | H05K 1/117 361/679.32 |
| 8,837,134 | B2 * | 9/2014 | Huang | G06F 1/1613 312/223.2 |
| 9,202,159 | B2 * | 12/2015 | Hsieh | H05K 5/0278 |
| 9,472,886 | B2 * | 10/2016 | Kang | H01R 13/447 |
| 9,478,891 | B2 * | 10/2016 | Kuo | G06K 19/07732 |
| 9,577,392 | B2 * | 2/2017 | Chang | H01R 24/60 |
| 9,640,912 | B1 * | 5/2017 | Chen | H01R 13/642 |
| 10,026,034 | B2 * | 7/2018 | Adachi | G06K 19/07732 |
| 10,058,003 | B1 * | 8/2018 | Wang | H05K 7/1427 |
| 10,083,388 | B1 * | 9/2018 | Harashima | G06K 19/07732 |
| 10,104,806 | B2 * | 10/2018 | Hayakawa | H05K 7/2039 |
| 2004/0233629 | A1 * | 11/2004 | Wang | B43K 29/08 361/679.4 |
| 2004/0233645 | A1 * | 11/2004 | Chen | G06F 1/1632 361/737 |
| 2004/0233646 | A1 * | 11/2004 | Yen | H05K 5/0278 361/752 |
| 2006/0199435 | A1 | 9/2006 | Foo et al. | |
| 2007/0015407 | A1 * | 1/2007 | Loftus | H01R 13/4538 439/607.01 |
| 2007/0127219 | A1 * | 6/2007 | Ho | H01R 13/4538 361/736 |
| 2007/0292009 | A1 * | 12/2007 | Nguyen | G06F 21/32 382/124 |
| 2008/0064265 | A1 * | 3/2008 | Sterling | B29C 45/16 439/660 |
| 2008/0144270 | A1 * | 6/2008 | Dal Porto | H05K 5/0278 361/679.31 |
| 2008/0280490 | A1 * | 11/2008 | Nguyen | G06F 12/1416 439/607.01 |
| 2009/0042433 | A1 * | 2/2009 | Bushby | H01R 13/4538 439/352 |
| 2009/0190277 | A1 * | 7/2009 | Hiew | G06F 1/1632 361/56 |
| 2010/0069117 | A1 | 3/2010 | Knighton | |
| 2010/0124831 | A1 * | 5/2010 | Chou | H01R 13/4538 439/131 |
| 2010/0315762 | A1 * | 12/2010 | Lo | H05K 5/0278 361/600 |
| 2012/0026661 | A1 * | 2/2012 | Ni | G06F 21/32 361/679.4 |
| 2013/0050910 | A1 * | 2/2013 | Pang | G06K 19/07732 361/679.01 |
| 2013/0201622 | A1 | 8/2013 | Liu et al. | |
| 2014/0085826 | A1 * | 3/2014 | Wu | G06K 19/07732 361/704 |
| 2014/0281139 | A1 * | 9/2014 | Smurthwaite | G06F 12/0246 711/103 |
| 2015/0043178 | A1 * | 2/2015 | Peng | H05K 7/1452 361/752 |
| 2017/0031855 | A1 * | 2/2017 | Zhou | G06F 3/0604 |
| 2017/0194747 | A1 * | 7/2017 | Hong | H01R 13/6581 |
| 2018/0046421 | A1 * | 2/2018 | Mazurek | G06F 3/14 |
| 2018/0081850 | A1 * | 3/2018 | Tseng | G06F 13/4282 |
| 2018/0309249 | A1 * | 10/2018 | Harashima | H01R 24/60 |

\* cited by examiner

SEMICONDUCTOR MEMORY DEVICE

CROSS-REFERENCE TO RELATED APPLICATIONS

This application is based upon and claims the benefit of priority from Japanese Patent Application No. 2018-048146, filed on Mar. 15, 2018 the entire contents of which are incorporated herein by reference.

FIELD

Embodiments described herein relate generally to a semiconductor memory device.

BACKGROUND

Semiconductor memory devices include a connector for providing a connection to a host device, for example. The sizes and shapes of connectors variously differ in conformity with standards such as USB Type-A, USB Mini-A, USB Mini-B, USB Micro-A, USB Micro-B, USB Type-C, and Lightning®.

The connector projects to outside of a casing through an opening of the casing. The openings of casings are variously designed in size and shape according to the different connector standards. Because of this, even the casings having substantially the same design need to be individually designed and manufactured according to the connector standards.

DETAILED DESCRIPTION

In general, according to one embodiment, a semiconductor memory device includes a casing, a substrate, a first electronic component, a second electronic component, a second connector, and an interposition member. The casing includes a first edge that forms the first opening that opens to outside. A first connector conforming to USB Type-A standard can pass through the first opening and be held by the first edge. The substrate is housed in the casing. The first electronic component is mounted on the substrate and stores therein information. The second electronic component is mounted on the substrate and controls the first electronic component. The second connector is mounted on the substrate and passes through the first opening away from at least a part of the first edge. The interposition member is interposed between an inner surface of the casing and the second connector, is held by the inner surface, and holds the second connector.

One embodiment is described below with reference to FIG. 1 to FIG. 7. The present embodiment may include a plurality of expressions for a constituent element according to the embodiment and the description of the element. The constituent element and description written with the plurality of expressions may be expressed in other non-described manners. Furthermore, the constituent element and description not described with a plurality of expressions may also be expressed in other non-described manners.

Figure 1:
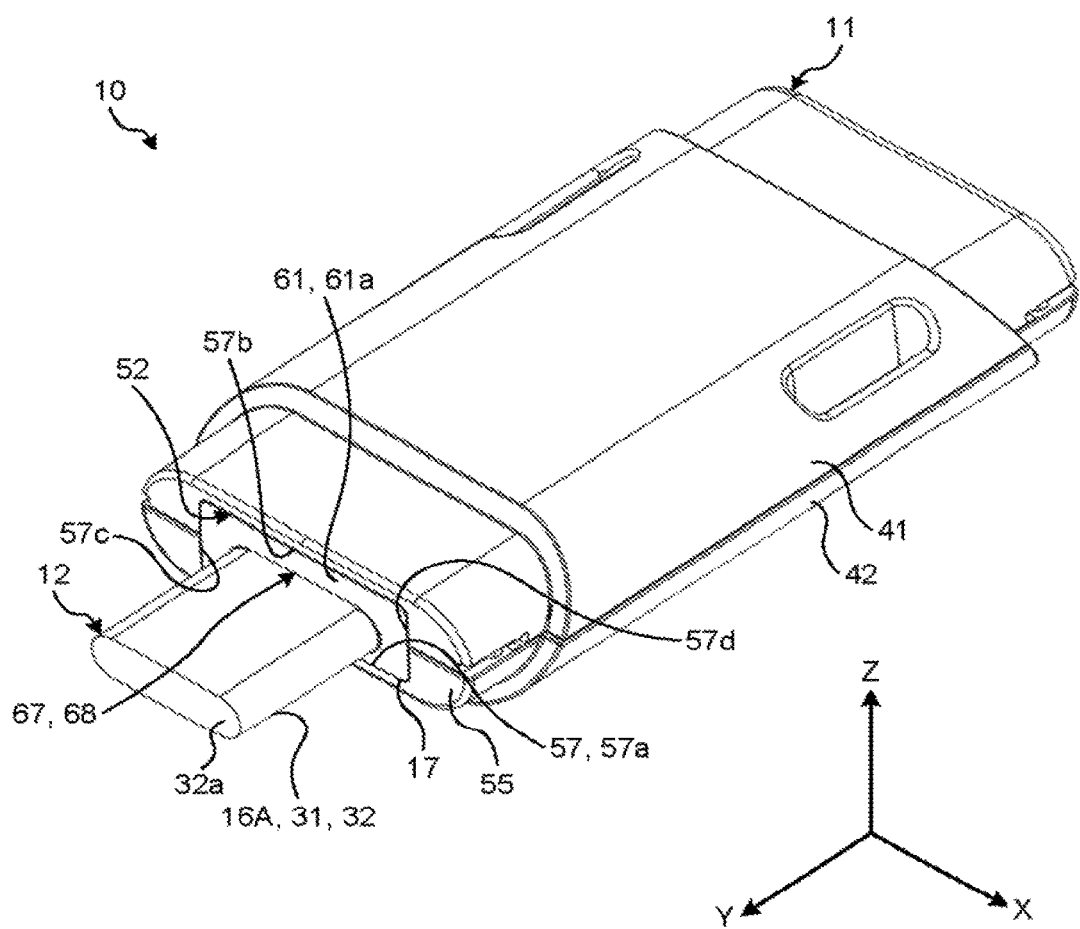
FIG. 1 is an exemplary perspective view illustrating a flash drive according to an embodiment.
Figure 2:
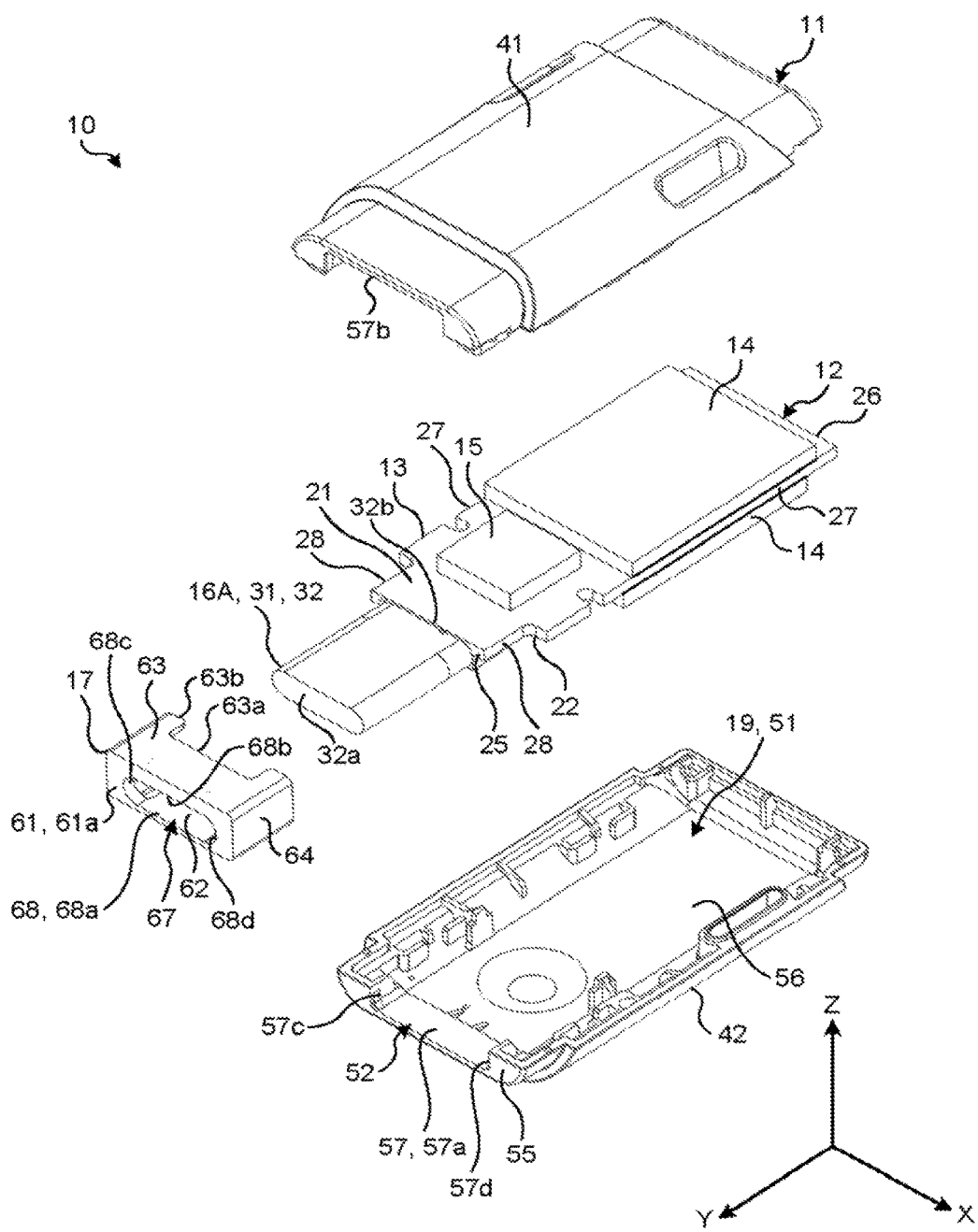
FIG. 2 is an exemplary exploded perspective view illustrating the flash drive according to the embodiment.

FIG. 1 is an exemplary perspective view illustrating a flash drive 10 according to one embodiment. FIG. 2 is an exemplary exploded perspective view illustrating the flash drive 10 according to the embodiment. The flash drive 10 is an example of a semiconductor memory device, and can be also referred to as, for example, USB flash drive (UFD), USB memory, electronic device, semiconductor device, USB device, storage, auxiliary storage, removable medium, or device. The semiconductor memory device can be another device.

As illustrated in FIG. 1, the flash drive 10 according to the present embodiment has, for example, a plate shape having a substantially oval cross-section. The flash drive 10 can have other shapes.

As illustrated in the respective drawings, in the present specification, an X axis, a Y axis, and a Z axis are defined. The X axis, the Y axis, and the Z axis are orthogonal to each other. The X axis lies along the width of the flash drive 10. The Y axis lies along the length of the flash drive 10. The Z axis lies along the thickness of the flash drive 10.

As illustrated in FIG. 2, the flash drive 10 includes a case 11 and a module 12. The module 12 includes a substrate 13, two flash memories 14, a controller 15, and a connector 16A. The flash drive 10 according to the present embodiment also includes a spacer 17.

The case 11 is an example of the casing. The flash memories 14 are an example of a first electronic component, and can be also referred to as, for example, nonvolatile memories, memories, or storage. The controller 15 is an example of a second electronic component, and can be also referred to as, for example, control unit. The connector 16A is an example of a second connector, and can be also referred to as, for example, plug, connection terminal, insertion, or connection. The spacer 17 is an example of an interposition member.

The substrate 13, the flash memories 14, the controller 15, a part of the connector 16A, and the spacer 17 are housed in an inner space 19 of the case 11. The inner space 19 is a space inside the case 11 and an example of an inside of the casing.

The connector 16A projects from the case 11 and can be covered with, for example, a lid (a cap) attachable to the case 11. The case 11 is, for example, made of metal. The case 11 can be made of other materials such as synthetic resin.

The substrate 13 is, for example, a printed circuit board (PCB). The substrate 13 can be another substrate such as a flexible printed circuit board (FPC). The substrate 13 has a substantially quadrangular (rectangular) plate shape extending in an X-Y plane. The substrate 13 can have another shape.

Figure 3:
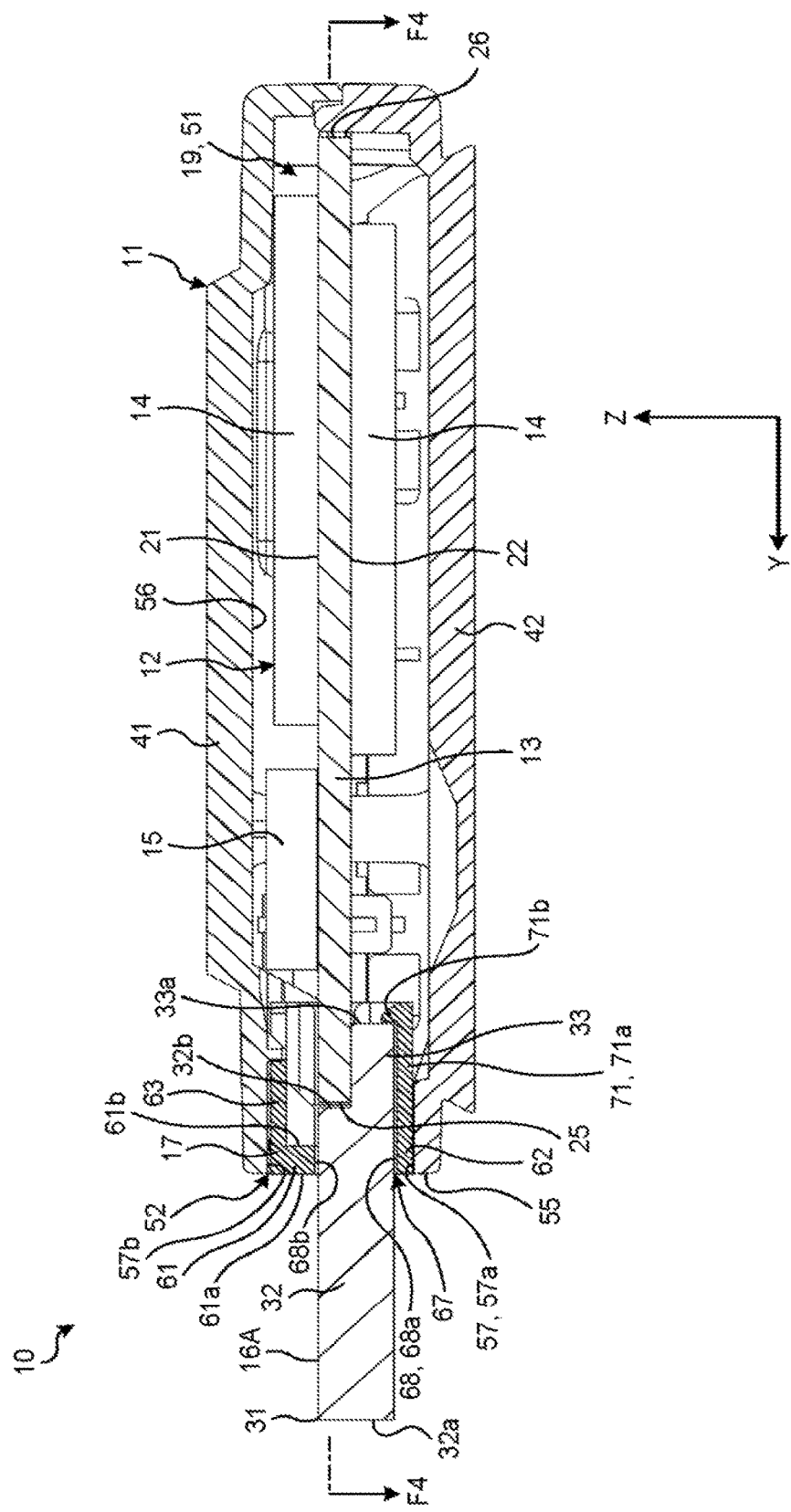
FIG. 3 is an exemplary sectional view illustrating the flash drive according to the embodiment.

FIG. 3 is an exemplary sectional view illustrating the flash drive 10 according to the embodiment. As illustrated in FIG. 3, the substrate 13 includes a first surface 21 and a second surface 22 which are substantially flat. The first surface 21 faces in a positive Z-axis direction (as indicated by the Z-axis arrow). The second surface 22 is opposite the first surface 21 and faces in a negative Z-axis direction (an opposite direction to the direction indicated by the Z-axis arrow).

Figure 4:
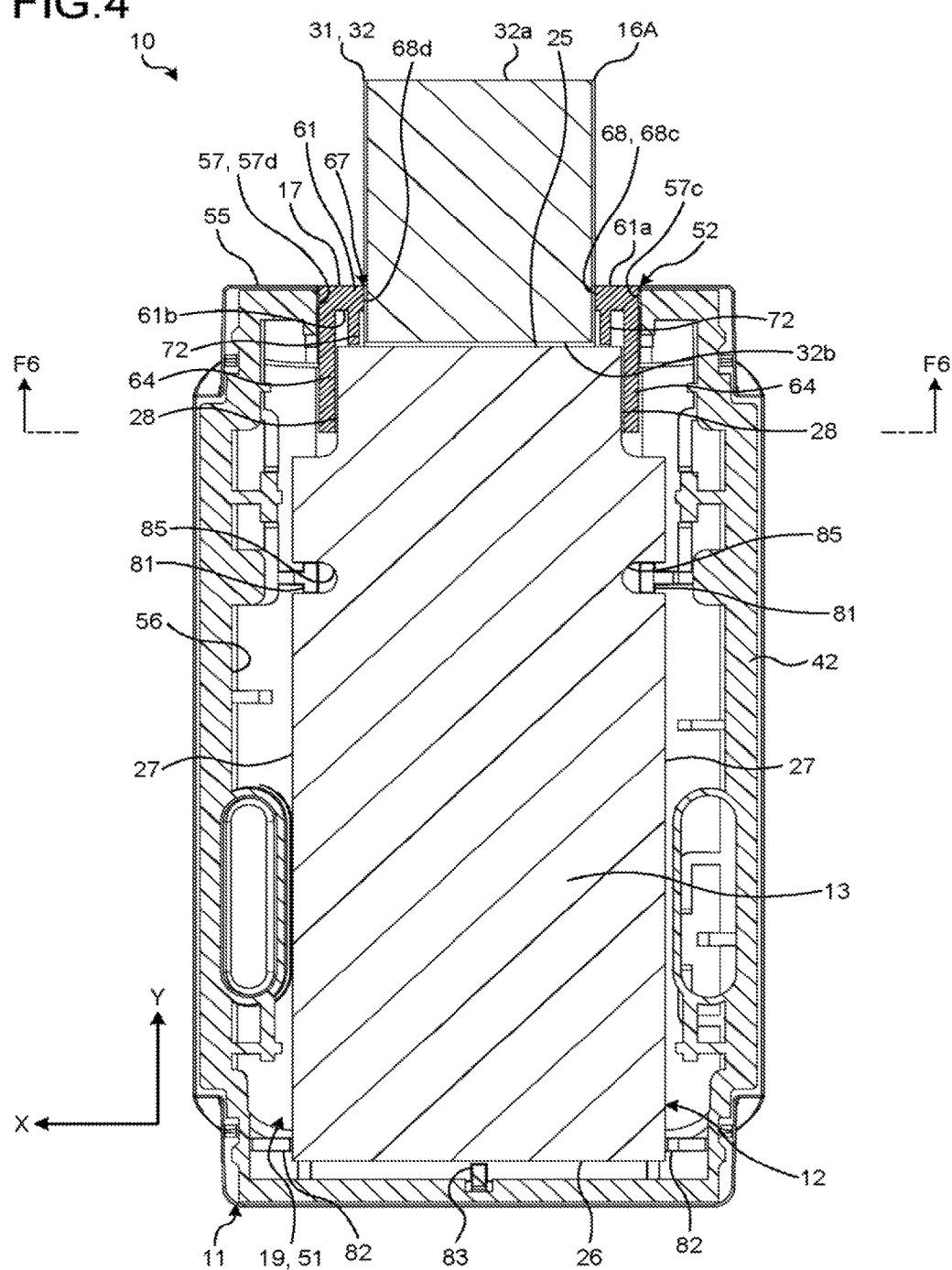
FIG. 4 is an exemplary sectional view illustrating the flash drive according to the embodiment along a line F4-F4 in FIG. 3.

FIG. 4 is an exemplary sectional view illustrating the flash drive 10 according to the embodiment along a line F4-F4 in FIG. 3. As illustrated in FIG. 4, the substrate 13 includes a first end edge 25, a second end edge 26, two first side edges 27, and two second side edges 28. The first end edge 25 is an example of an end of the substrate in a first direction. Each of the first end edge 25, the second end edge 26, the first side edges 27, and the second side edges 28 is connected to an edge of the first surface 21 and an edge of the second surface 22.

The first end edge 25 is the end of the substrate 13 in a positive Y axis direction (as indicated by the Y-axis arrow). The positive Y axis direction is an example of the first direction. The second end edge 26 is the end of the substrate 13 in a negative Y axis direction (an opposite direction to the direction indicated by the Y-axis arrow). The negative Y axis direction is an opposite direction to the positive Y axis direction and is an example of a second direction. The first end edge 25 and the second end edge 26 extend in the X-axis direction. The X-axis direction includes a positive X-axis direction (as indicated by the X-axis arrow) and a negative X-axis direction (an opposite direction to the direction indicated by the X-axis arrow).

The two first side edges 27 are opposite ends of the substrate 13 in the X-axis direction. The first side edges 27 extend in the Y-axis direction and are connected to opposite ends of the second end edges 26 in the X-axis direction. The Y-axis direction includes the positive and negative Y-axis directions.

The two second side edges 28 are near the first end edge 25 and the opposite ends of the substrate 13 in the X-axis direction. The second side edges 28 extend in the Y-axis direction and are respectively connected to the opposite ends of the first end edges 25 in the X-axis direction. In the X-axis direction, a distance between the two second side edges 28 is shorter than a distance between the two first side edges 27.

The substrate 13 has a substantially oblong shape extending in the Y-axis direction in a planar view facing in the Z-axis direction as in FIG. 4. The Z-axis direction includes the positive and negative Z-axis directions. A distance between the first end edge 25 and the second end edge 26 in the Y-axis direction is longer than a distance between the two first side edges 27 in the X-axis direction.

The first end edge 25 and the second end edge 26 form the short sides of the substrate 13. The first side edges 27 and the second side edges 28 form the long sides of the substrate 13. The Y-axis direction can be referred to as "long-side direction of the substrate 13". The X-axis direction can be referred to as "short-side direction of the substrate 13".

As illustrated in FIG. 3, the two flash memories 14 are separately mounted on the first surface 21 and the second surface 22 of the substrate 13. For example, a plurality of terminals is arranged in the flash memories 14 and electrically connected to a plurality of electrodes provided on the first surface 21 and the second surface 22 with solder. The flash memories 14 can be mounted on either of the first surface 21 and the second surface 22.

The flash memory 14 is an electronic component that can store therein information, and is, for example, a NAND flash memory. The flash drive 10 can also include other nonvolatile memories such as a NOR flash memory, a magnetoresistive random access memory (MRAM), a phase change random access memory (PRAM), a resistive random access memory (ReRAM), or a ferroelectric random access memory (FeRAM).

The controller 15 is mounted on the first surface 21 of the substrate 13. For example, a plurality of terminals is disposed on the controller 15 and electrically connected to electrodes provided on the first surface 21 with solder. The controller 15 can be mounted on the second surface 22. For example, the controller 15 controls the flash memories 14 and controls communication between the flash drive 10 and a host device. The controller 15 is located between the flash memory 14 and the first end edge 25 of the substrate 13 in the Y-axis direction.

The connector 16A is, for example, a male connector (a plug) conforming to USB Type-C standard. The USB Type-C standard includes, for example, USB 2.0 Type-C, USB 3.1 Gen1 Type-C, and USB 3.1 Gen2 Type-C. The connector 16A includes a shell 31 made of metal. The shell 31 includes an insertion 32 and a mount 33.

The insertion 32 has a substantially oval cross-section and extends in the Y-axis direction. The insertion 32 includes a front end 32a and a base end 32b. In the present specification, nominal designation such as "front", "rear", "top", and "bottom" is intended only for the sake of convenience and not intended to limit positions and directions.

The front end 32a is the end of the insertion 32 in the positive Y-axis direction. The base end 32b is the end of the insertion 32 in the negative Y-axis direction and is opposite the front end 32a. The base end 32b and the first end edge 25 of the substrate 13 face each other.

The front end 32a is provided with an opening. A plurality of electrodes is arranged in the opening. The number of electrodes is, for example, twenty four and can be less or more than twenty four. The insertion 32 is inserted into a USB connector (a female connector, a socket), for example, of the host device. An electrode in the socket is inserted into the opening of the front end 32a and electrically connected to the electrode of the connector 16A. Thereby, the flash drive 10 and the host device are electrically connected.

The mount 33 extends from the base end 32b of the insertion 32 along the second surface 22 of the substrate 13 in the negative Y-axis direction. The mount 33 includes a rear end 33a. The rear end 33a is an example of an end of the second connector in the second direction.

In the present embodiment, the rear end 33a is the end of the mount 33 and the end of the connector 16A in the negative Y-axis direction. The front end 32a of the insertion 32 is the end of the connector 16A in the positive Y-axis direction.

The mount 33 is provided with a plurality of pins. The pins are connected to the electrodes in the opening of the front end 32a, and are electrically connected to the electrodes on the second surface 22 with solder. That is, the connector 16A is mounted on the second surface 22 of the substrate 13. The connector 16A can be mounted on the first surface 21 or can be electrically connected to the electrodes on both of the first surface 21 and the second surface 22.

As illustrated in FIG. 2, the case 11 includes a first cover 41 and a second cover 42. The first cover 41 covers the first surface 21 of the substrate 13. The second cover 42 covers the second surface 22 of the substrate 13.

The first cover 41 and the second cover 42 are fixed to each other, forming the case 11, for example, by a snap-fit connection or with screws. Alternatively, the first cover 41 and the second cover 42 can be integrally formed, for example.

As illustrated in FIG. 3, the inner space 19 of the case 11 includes a chamber 51 and a first opening 52. A part of the substrate 13, the flash memories 14, the controller 15, a part of the connector 16A, and a part of the spacer 17 are housed in the chamber 51. The chamber 51 is communicated with outside of the case 11 through the first opening 52. A part of the substrate 13, a part of the connector 16A, and a part of the spacer 17 are housed in the first opening 52.

The case 11 includes an end face 55 and an inner surface 56. The end face 55 is the end of the case 11 in the positive Y-axis direction. The end face 55 is substantially flat and faces in the positive Y-axis direction. The first opening 52 opens to the end face 55. Thus, the first opening 52 opens to the outside of the case 11. The inner surface 56 faces the inside of the case 11 and forms (defines) the inner space 19. The inner surface 56 includes a first edge 57 that forms (defines) the first opening 52.

The first opening 52 is a hole having a substantially quadrangular (rectangular) cross-section and extending in the Y-axis direction. That is, the first edge 57 is also a substantially quadrangular (rectangular) tubular face. As illustrated in FIG. 1, the first edge 57 includes four first flat faces 57a, 57b, 57c, and 57d.

The first flat face 57a faces in the positive Z-axis direction. The first flat face 57b faces in the negative Z-axis direction. The first flat faces 56a and 56b face each other. The first flat face 57c faces in the positive X-axis direction. The first flat face 57d faces in the negative X-axis direction. The first flat faces 57c and 57d face each other. The lengths of the first flat faces 57a and 57b in the X-axis direction are longer than the lengths of the first flat faces 57c and 57d in the Z-axis direction.

Figure 5:
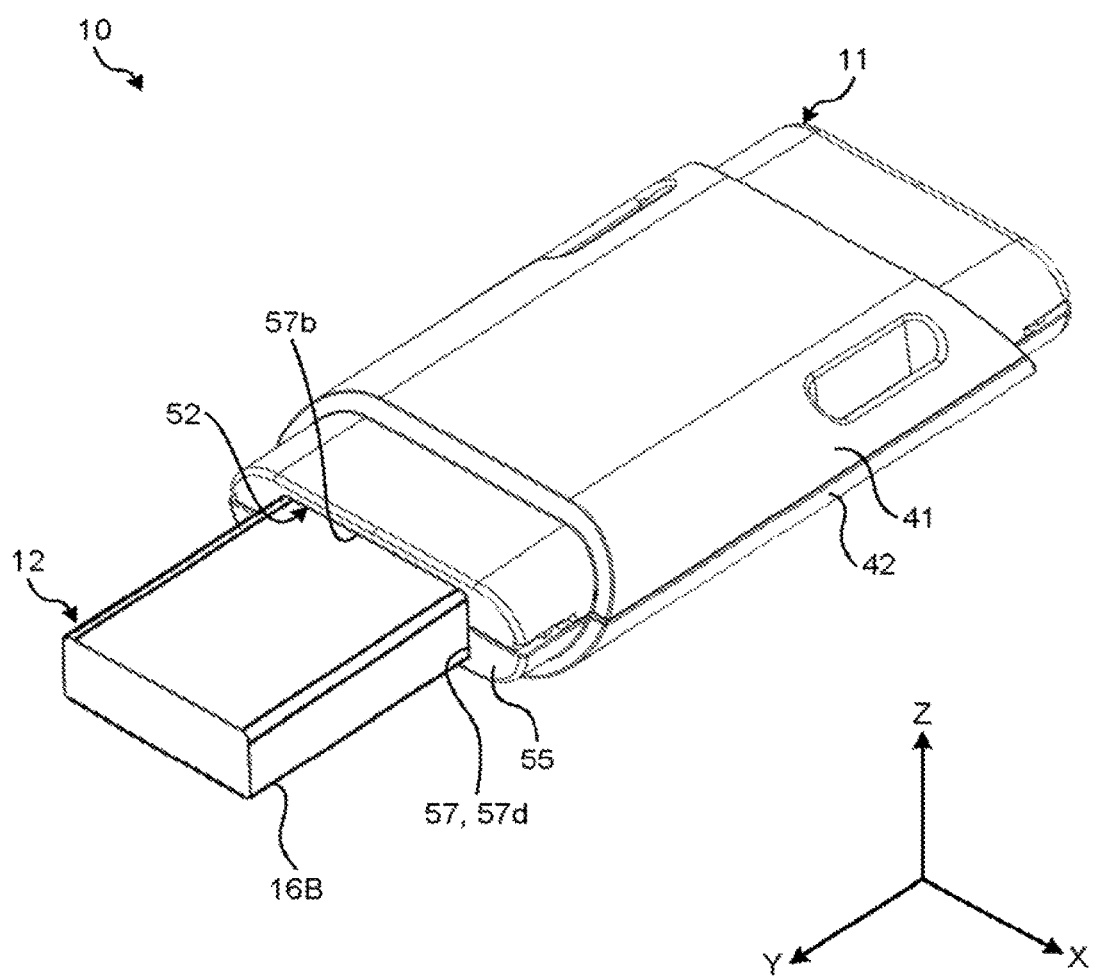
FIG. 5 is an exemplary perspective view illustrating the flash drive including a connector different from a connector in FIG. 1.

FIG. 5 is an exemplary perspective view illustrating the flash drive 10 including a connector 16B instead of the connector 16A according to the embodiment. The connector 16B is an example of the first connector and is a male connector conforming to USB Type-A standard. The USB Type-A standard is also referred to as "USB Standard-A" and includes, for example, USB 2.0 Type-A, USB 3.1 Gen1 Type-A, and USB 3.1 Gen2 Type-A. The USB Type-A male connector can be also referred to as, for example, "USB-A connector" or "USB-A plug".

As illustrated in FIG. 5, the first opening 52 has substantially the same cross-section as that of the USB Type-A connector 16B, and has a size and a shape sufficient to allow the connector 16B to pass therethrough. Specifically, the first opening 52 has a substantially quadrangular cross-section of about 12 millimeters×4.5 millimeters.

The connector 16B, while passing through the first opening 52 in the Y-axis direction, is held by the first edge 57. In other words, the connector 16B is fitted into the first edge 57 and the first edge 57 surrounds the connector 16B so as to restrict the movement of the connector 16B with respect to the case 11 in a direction intersecting with the Y-axis direction.

The first flat faces 57a, 57b, 57c, and 57d contact the connector 16B or face the connector 16B with a small gap. The first flat face 57a restricts the movement of the connector 16B with respect to the case 11 in the negative Z-axis direction. The first flat face 57b restricts the movement of the connector 16B with respect to the case 11 in the positive Z-axis direction. The first flat face 57c restricts the movement of the connector 16B with respect to the case 11 in the negative X-axis direction. The first flat face 57d restricts the movement of the connector 16B with respect to the case 11 in the positive X-axis direction.

The first opening 52 and the first edge 57 can be used for other purposes, so long as the USB Type-A connector 16B can pass through the first opening 52 and be held by the first edge 57. For example, the first opening 52 and the first edge 57 can be formed such that a connector conforming to another standard can pass through the first opening 52 and be held by the first edge 57.

As described above, the USB Type-A connector 16B can be fitted in the first opening 52. However, in the present embodiment, the USB Type-C connector 16A and the spacer 17 are fitted in the first opening 52.

As is obvious from FIG. 1 and FIG. 5, the connector 16A is smaller than the connector 16B. As illustrated in FIG. 2, the connector 16A is mounted on the substrate 13 and extends from the substrate 13 in the positive Y-axis direction. The connector 16A then projects to outside of the case 11 through the first opening 52.

In an X-Z plane orthogonal to the Y axis, the cross-section of the connector 16A is smaller than the cross-section of the first opening 52. Inside the first opening 52, the connector 16A is located apart from the first edge 57. The connector 16A can be separated from a part of the first edge 57 and contact with another part of the first edge 57.

The spacer 17 is made of metal and has a substantially quadrangular (rectangular) tubular shape, for example. The spacer 17 can be made of other materials such as synthetic resin or can have other shapes.

The spacer 17 is housed in the first opening 52 and surrounds the connector 16A. Thus, the spacer 17 is interposed between the first edge 57 of the case 11 and the shell 31 of the connector 16A, closing the gap between the first edge 57 and the shell 31. The spacer 17 includes an end wall 61, a bottom wall 62, a top wall 63, and two side walls 64.

The end wall 61 is a substantially quadrangular wall of about 12 millimeters×4.5 millimeters extending in the X-Z plane. As illustrated in FIG. 3, the end wall 61 includes an outer surface 61a and an inner surface 61b that are substantially flat. The outer surface 61a faces in the positive Y-axis direction. The inner surface 61b is opposite the outer surface 61a and faces in the negative Y-axis direction.

With the spacer 17 housed in the first opening 52, the outer surface 61a and the end face 55 of the case 11 are aligned with each other on substantially the same plane. The outer surface 61a can be separated from the end face 55 in the positive or negative Y-axis direction.

The end wall 61 is provided with a second opening 67. The second opening 67 extends through the end wall 61 in the Y-axis direction and opens to the outer surface 61a and the inner surface 61b. The end wall 61 further includes a second edge 68 forming (defining) the second opening 67.

As illustrated in FIG. 2, the second opening 67 is a hole having a substantially oval cross-section. Thus, the second edge 68 is also a substantially oval tubular face. The second edge 68 includes two second flat faces 68a and 68b and two curved faces 68c and 68d.

The second flat face 68a faces in the positive Z-axis direction. The second flat face 68b faces in the negative Z-axis direction. The second flat faces 68a and 68b face each other. The curved face 68c is arc-like recessed in the negative X-axis direction. The curved face 68d is arc-like recessed in the positive X-axis direction. The curved faces 68c and 68d face each other.

The second opening 67 has substantially the same size and shape as the end face of the USB Type-C connector 16A, and allows the insertion 32 of the connector 16A to be inserted therethrough. Specifically, the second opening 67 has a substantially oval cross-section of about 8.34 millimeters×2.56 millimeters. The insertion 32 of the connector 16A projects to outside of the case 11 through the second opening 67 in the Y-axis direction.

By inserting the insertion 32 of the connector 16A through the second opening 67, the connector 16A is held by the second edge 68. In other words, the insertion 32 of the connector 16A is fitted into the second edge 68, and the second edge 68 surrounds the insertion 32 of the connector 16A so as to restrict the movement of the connector 16A with respect to the spacer 17 in a direction intersecting with the Y-axis direction.

The second flat faces 68a and 68b and the curved faces 68c and 68d all contact with the insertion 32 of the connector 16A or face the insertion 32 with a small gap. The second flat face 68a restricts the movement of the connector 16A with respect to the spacer 17 in the negative Z-axis direction. The second flat face 68b restricts the movement of the connector 16A with respect to the spacer 17 in the positive Z-axis direction. The curved face 68c restricts the movement of the connector 16A with respect to the spacer 17 in the negative X-axis direction. The curved face 68d restricts the movement of the connector 16A with respect to the spacer 17 in the positive X-axis direction.

As illustrated in FIG. 3, the bottom wall 62 extends in the negative Y-axis direction from the end of the end wall 61 in the negative Z-axis direction. The bottom wall 62 and the second flat face 68a of the second edge 68 contact the connector 16A or faces the connector 16A with a small gap. The bottom wall 62 restricts the movement of the connector 16A with respect to the spacer 17 in the negative Z-axis direction.

The top wall 63 extends in the negative Y-axis direction from the end of the end wall 61 in the positive Z-axis direction. The top wall 63 is separated from the connector 16A. The top wall 63 and the second flat face 68b of the second edge 68 can face the connector 16A.

As illustrated in FIG. 2, the top wall 63 is provided with a cutout 63a. The cutout 63a is recessed in the positive Y-axis direction from an end 63b of the top wall 63 in the negative Y-axis direction. By the cutout 63a, the top wall 63 is spaced apart from the controller 15.

As illustrated in FIG. 4, the two side walls 64 extend in the negative Y-axis direction from the X-axial opposite ends of the end wall 61. The Z-axial opposite ends of the side walls 64 are connected to the bottom wall 62 and the top wall 63. The two side walls 64 contact with the second side edges 28 of the substrate 13 or face the second side edges 28 with a small gap. The two side walls 64 restrict the movement of the substrate 13 with respect to the spacer 17 in the X-axis direction.

As illustrated in FIG. 1, the spacer 17 is interposed between the connector 16A and the first edge 57 and is held by the first edge 57. In other words, the spacer 17 is fitted into the first edge 57, and the first edge 57 surrounds the spacer 17 so as to restrict the movement of the spacer 17 with respect to the case 11. The first flat faces 57a, 57b, 57c, and 57d of the first edge 57 contact with the spacer 17 or face the spacer 17 with a small gap.

The first flat face 57a faces the bottom wall 62 and restricts the movement of the spacer 17 with respect to the case 11 in the negative Z-axis direction. The first flat face 57b faces the top wall 63 and restricts the movement of the spacer 17 with respect to the case 11 in the positive Z-axis direction. The first flat face 57c faces one of the side walls 64 and restricts the movement of the spacer 17 with respect to the case 11 in the negative X-axis direction. The first flat face 57d faces the other of the side walls 64 and restricts the movement of the spacer 17 with respect to the case 11 in the positive X-axis direction. The spacer 17 can be held by the inner surface 56 away from the first edge 57 in the negative Y-axis direction.

The shell 31 of the connector 16A comes into contact with the second edge 68 of the metal spacer 17. The spacer 17 also comes into contact with the first edge 57 of the metal case 11. Thus, the shell 31 is electrically connected to the case 11 via the spacer 17. The shell 31 is connected, for example, to the ground of a circuit of the module 12.

The spacer 17 is not directly fixed to the case 11 but fixed to the module 12 including the substrate 13 and the connector 16A. Because of this, along with Y-axial movement of the module 12 with respect to the case 11, the spacer 17 can move in the Y-axis direction with respect to the case 11. The spacer 17 can be directly fixed to the case 11.

Figure 6:
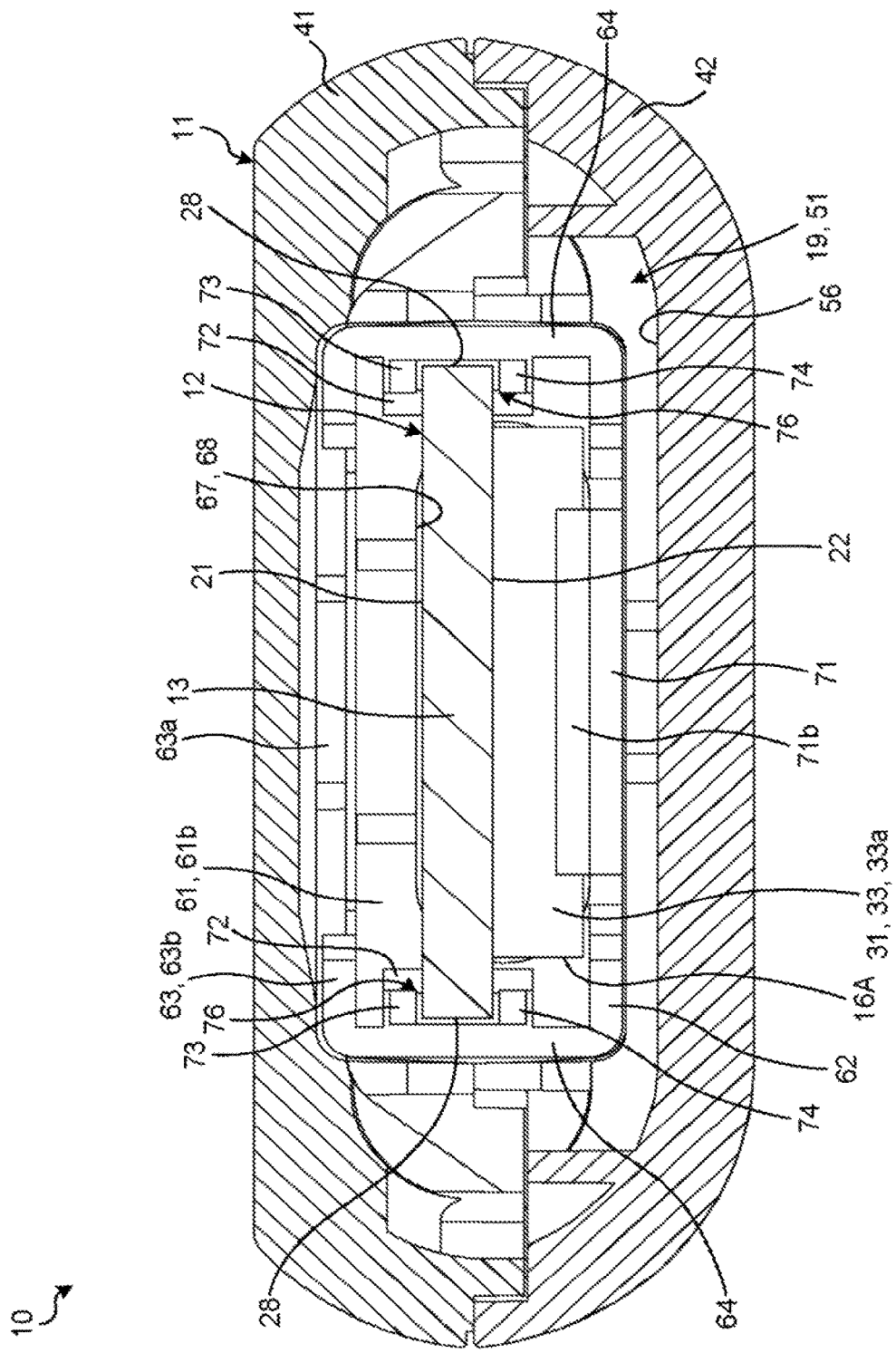
FIG. 6 is an exemplary sectional view illustrating the flash drive according to the embodiment along a line F6-F6 in FIG. 4.

FIG. 6 is an exemplary sectional view illustrating the flash drive 10 according to the embodiment along a line F6-F6 in FIG. 4. The spacer 17 further includes a first restrictor 71 illustrated in FIG. 3, two second restrictors 72 illustrated in FIG. 4, and two third restrictors 73 and two fourth restrictors 74 illustrated in FIG. 6. The spacer 17 is fixed to the module 12 including the substrate 13 and the connector 16A through the bottom wall 62, the side walls 64, the second edge 68, the first restrictor 71, the second restrictors 72, the third restrictors 73, and the fourth restrictors 74.

As illustrated in FIG. 3, the first restrictor 71 is located on the bottom wall 62 and includes an elastic portion 71a and a stop 71b. The elastic portion 71a is a part of the bottom wall 62 extending in the negative Y-axis direction from the vicinity of the end wall 61. The elastic portion 71a can be elastically bent away from the connector 16A about the fulcrum in the vicinity of the end wall 61. The stop 71b projects in the positive Z-axis direction from the end of the elastic portion 71a in the negative Y-axis direction.

The stop 71b contacts the rear end 33a of the mount 33 of the connector 16A or faces the rear end 33a with a small gap. The stop 71b restricts the movement of the connector 16A with respect to the spacer 17 in the negative Y-axis direction.

By the elastic deformation of the elastic portion 71a away from the connector 16A, the stop 71b is moved away from the rear end 33a of the connector 16A in the negative Z-axis direction. Thereby, the stop 71b allows the movement of the connector 16A with respect to the spacer 17 in the negative Y-axis direction.

The elastic portion 71a is located between the connector 16A and the first flat face 57a of the first edge 57. The first flat face 57a faces the elastic portion 71a and restricts the elastic portion 71a from elastically deforming away from the connector 16A. In this manner, with the spacer 17 interposed between the connector 16A and the first edge 57, the stop 71b is prevented from moving apart from the rear end 33a of the connector 16A in the negative Z-axis direction.

As illustrated in FIG. 4, the second restrictors 72 project from the inner surface 61b of the end wall 61 in the negative Y-axis direction. The second restrictors 72 contact the first end edge 25 of the substrate 13 or face the first end edge 25 with a small gap. The second restrictors 72 restrict the movement of the substrate 13 with respect to the spacer 17 in the positive Y-axis direction.

In the Y-axis direction, a distance between the stop 71b of the first restrictor 71 and the second restrictors 72 is substantially equal to a distance between the first end edge 25 of the substrate 13 and the rear end 33a of the connector 16A. Thus, the first restrictor 71 and the second restrictors 72 restrict the movement of the module 12 including the substrate 13 and the connector 16A with respect to the spacer 17 in the Y-axis direction.

As described in FIG. 6, the two third restrictors 73 project from the two side walls 64. The third restrictors 73 contact the first surface 21 of the substrate 13 or face the first surface 21 with a small gap. The third restrictors 73 restrict the movement of the substrate 13 with respect to the spacer 17 in the positive Z-axis direction.

The two fourth restrictors 74 project from the two side walls 64. The fourth restrictors 74 contact the second surface 22 of the substrate 13 or face the second surface 22 with a small gap. The fourth restrictors 74 restrict the movement of the substrate 13 with respect to the spacer 17 in the negative Z-axis direction.

Grooves 76 are provided between the third restrictors 73 and the fourth restrictors 74. The grooves 76 extend in the Y-axis direction and are open in the negative Y-axis direction. The second side edges 28 of the substrate 13 are housed in the grooves 76.

As described above, the connector 16A is mounted on the substrate 13. The bottom wall 62, the side walls 64, the second edge 68, the first restrictor 71, the second restrictors 72, the third restrictors 73, and the fourth restrictors 74 restrict the movement of the connector 16A and the substrate 13 with respect to the spacer 17 in the X-axis direction, the Y-axis direction, and the Z-axis direction. This fixes the spacer 17 to the module 12 including the connector 16A and the substrate 13.

As illustrated in FIG. 2, for example, the connector 16A, while mounted on the substrate 13, is inserted through the second opening 67. In the manufacturing process of the flash drive 10, the flash memories 14, the controller 14, and the connector 16A are first mounted on the substrate 13. That is, the connector 16A is inserted through the second opening 67 in the positive Y-axis direction in the assembled module 12.

As illustrated in FIG. 6, while the connector 16A is inserted through the second opening 67, the second side edges 28 of the substrate 13 are fitted into the grooves 76. Thus, the third restrictors 73 and the fourth restrictors 74 forming the grooves 76 guide the substrate 13.

Further, while the connector 16A is inserted through the second opening 67, the stop 71b of the first restrictor 71 is pressed by the connector 16A to bend the elastic portion 71a elastically. When the first end edge 25 of the substrate 13 abuts on the second restrictors 72, the elastic portion 71a is restored so that the stop 71b faces the rear end 33a of the mount 33. In this manner, the spacer 17 is fixed to the connector 16A and the substrate 13.

The connector 16A mounted on the substrate 13 is detachable from the second opening 67. For example, by elastically bending the elastic portion 71a of the first restrictor 71, the stop 71b is displaced from the connector 16A. Thereby, the connector 16A can be pulled out from the second opening 67 in the negative Y-axis direction, to detach the connector 16A and the substrate 13 from the spacer 17.

As illustrated in FIG. 4, the case 11 includes a plurality of first ribs 81, a plurality of second ribs 82, and a third rib 83. The first ribs 81 are an example of a fifth restrictor. The first ribs 81, the second ribs 82, and the third rib 83 project from the inner surface 56 of the case 11.

The two first side edges 27 of the substrate 13 are each provided with a cutout 85. A part of each first rib 81 is housed in the cutout 85. The first ribs 81 face the edges of the cutouts 85. Another part of each first rib 81 faces the first surface 21 and the second surface 22 of the substrate 13. Thereby, the first ribs 81 restrict the movement of the substrate 13 with respect to the case 11 in the Y-axis direction and the Z-axis direction.

A part of each second rib 82 faces the first side edge 27. Another part of the second rib 82 faces the first surface 21 and the second surface 22 of the substrate 13. Thus, the second ribs 82 restrict the movement of the substrate 13 with respect to the case 11 in the X-axis direction and the Z-axis direction.

The third rib 83 faces the second end edge 26. Thus, the third rib 83 restricts the movement of the substrate 13 with respect to the case 11 in the negative Y-axis direction. As described above, the first ribs 81, the second ribs 82, and the third rib 83 fix the substrate 13 to the case 11. The spacer 17 is fixed to the case 11 indirectly via the substrate 13.

Figure 7:
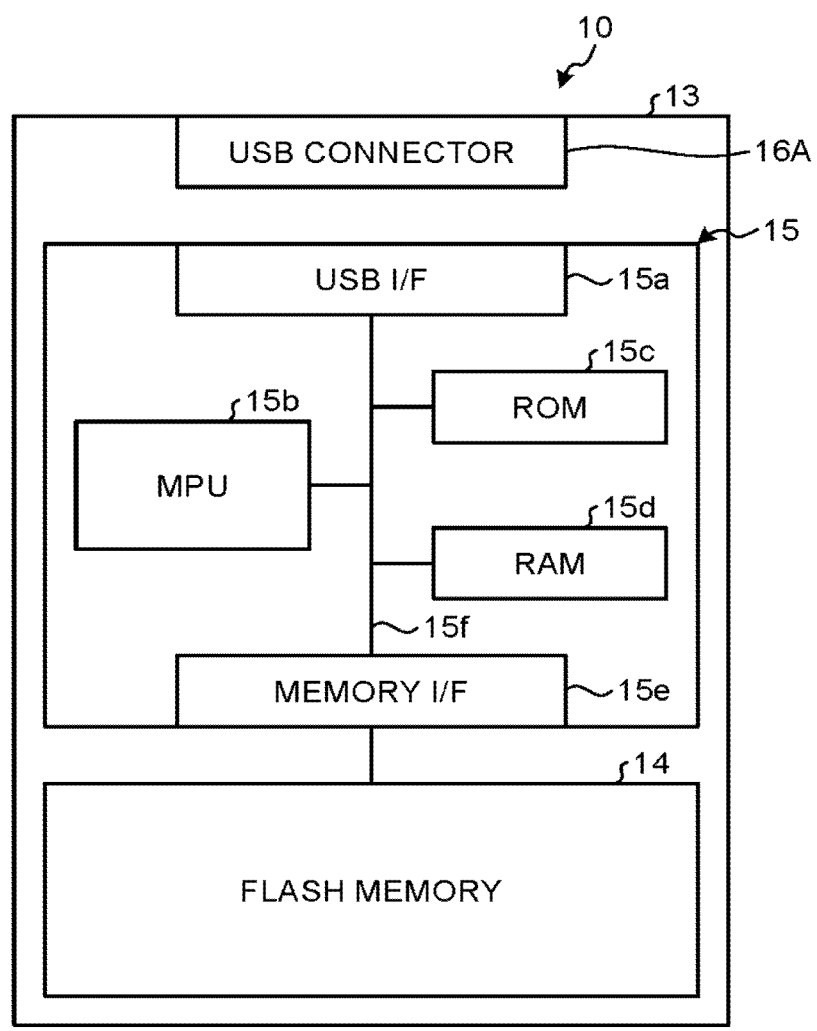
FIG. 7 is a block diagram illustrating an example of a configuration of the flash drive according to the embodiment.

FIG. 7 is a block diagram illustrating an example of a configuration of the flash drive 10 according to the embodiment. As illustrated in FIG. 7, the controller 15 controls data transmission between the connector 16A and the flash memories 14.

The controller 15 includes a USB interface (I/F) 15a, an MPU 15b, a ROM 15c, a RAM 15d, a memory interface (I/F) 15e, and an internal bus 15f. The USB I/F 15a, the MPU 15b, the ROM 15c, the RAM 15d, the memory I/F 15e, and the internal bus 15f are formed, for example, on one semiconductor substrate.

The USB I/F 15a receives data and commands from a host device via the connector 16A. The data and the commands are written in standard format of, for example, a small computer system interface (SCSI). The USB I/F 15a reads data from the flash memory 14 and outputs the data to the host device via the connector 16A according to the SCSI standard format.

The MPU 15b processes a command received from the host device and data received from the flash memories 14 using, for example, the ROM 15c and the RAM 15d. When the flash drive 10 is connected to the host device, the MPU 15b performs authentication between the host device and the flash drive 10.

The ROM 15c holds data and programs required for the processing by the MPU 15b. The RAM 15d functions as a work area for the processing by the MPU 15b. The RAM 15d is, for example, a volatile semiconductor memory such as a DRAM.

The memory I/F 15e is connected to the flash memories 14, for example, through wiring. The memory I/F 15e transfers a command and data received by the USB I/F 15a to the flash memories 14 and transfers data read from the flash memories 14 to the USB I/F 15a in response to a command from the MPU 15b.

The flash memory 14 reads and outputs data in response to a read command from the controller 15. The flash memory 14 records data in response to a write command from the controller 15.

In the flash drive 10 according to the embodiment described above, the connector 16A passes through the first opening 52 with spacing from at least a part of the first edge 57 in which the USB Type-A connector 16B can be held. The spacer 17 is interposed between the inner surface 56 of the case 11 including the first edge 57 and the connector 16A, is held by the inner surface 56, and holds the connector 16A. Thereby, the connector 16A is stably held, while passing through the first opening 52 through which the connector 16B is passable, for example. Thus, the connector 16A can be inserted through the first opening 52 instead of the connector 16B, enabling shared use of the case 11 by different types of flash drives, i.e., the flash drive 10 illustrated in FIG. 5 including the connector 16B and the flash drive 10 illustrated in FIG. 1 including the connector 16A. The shared use of the case 11 leads to reducing mold manufacturing cost, a design and evaluation period of the case 11, and a setup period of manufacturing facilities, for example, thereby reduce the manufacturing cost of the flash drive 10.

The spacer 17 is interposed between the first edge 57 and the connector 16A and is held by the first edge 57. Thereby, the spacer 17 fills the gap between the first edge 57 and the connector 16A, which can avoid deterioration in the design quality of the flash drive 10 including the connector 16A.

The spacer 17 includes the second edge 68 forming the second opening 67. The connector 16A passes through the second opening 67 and is held by the second edge 68. Thus, the spacer 17 and the connector 16A can be easily attached to each other, thereby facilitating the assembly of the flash drive 10.

The connector 16A, while mounted on the substrate 13, can be inserted through the second opening 67 detachably. Thereby, the spacer 17 can be attached to the connector 16A mounted on the substrate 13. That is, the spacer 17 and the connector 16A can be easily attached to each other, thereby facilitating the assembly of the flash drive 10.

The spacer 17 includes the first restrictor 71, which faces the rear end 33a of the connector 16A to restrict the movement of the connector 16A with respect to the spacer 17 in the negative Y-axis direction, and the second restrictors 72, which face the first end edge 25 of the substrate 13 to restrict the movement of the substrate 13 with respect to the spacer 17 in the positive Y-axis direction. The first restrictor 71 elastically deforms and moves away from the rear end 33a of the connector 16A to allow the movement of the connector 16A with respect to the spacer 17 in the negative Y-axis direction. Thereby, the spacer 17 is unlikely to be displaced from the connector 16A. Further, the elastic deformation of the first restrictor 71 facilitates the attachment of the spacer 17 and the connector 16A, thereby facilitating the assembly of the flash drive 10.

The spacer 17 includes the third restrictors 73, which face the first surface 21 of the substrate 13 to restrict the movement of the substrate 13 with respect to the spacer 17 in the positive Y-axis direction, and the fourth restrictors 74, which face the second surface 22 of the substrate 13 to restrict the movement of the substrate 13 with respect to the spacer 17 in the negative Y-axis direction. Thus, both the connector 16A and the substrate 13 are held by the first edge 57, the third restrictors 73, and the fourth restrictors 74. That is, the substrate 13 and the connector 16A mounted on the substrate 13 are stably held.

The connector 16A includes the shell 31 electrically connected to the case 11 via the spacer 17. This enables the ground of the connector 16A to connect to the metal case 11, for example.

The spacer 17 is indirectly fixed to the case 11 through the connector 16A and the substrate 13. This eliminates the necessity for the case 11 to additionally include a part for fixing the spacer 17, which further facilitates the shared use of the case 11 by the flash drive 10 including the connector 16B and the flash drive 10 including the connector 16A.

The connector 16A conforms to the USB Type-C standard. That is, the USB Type-C connector 16A can be inserted through the first opening 52 instead of the USB Type-A connector 16B, for example. Thus, the flash drive 10 including the connector 16B and the flash drive 10 including the connector 16A can share the case 11, the flash memories 14, and the controller 15, thereby reducing the manufacturing cost of the flash drives 10.

In the embodiment described above, the connector 16A conforms to the USB Type-C standard. Alternatively, the connector 16A can also conform to other standards such as USB Mini-A, USB Mini-B, USB Micro-A, USB Micro-B, USB Type-C, and Lightning®. The connector 16A conforming to another standard is also smaller than the USB Type-A connector 16B.

According to at least the embodiment described above, a second connector passes through a first opening with spacing from at least a part of a first edge by which a first connector conforming to USB Type-A standard can be held. An interposition member is interposed between an inner surface of a casing and the second connector, is held by the inner surface, and holds the second connector. Thus, the second connector is stably held, while passing through the first opening through which the first connector is to pass. That is, the second connector can be inserted through the first opening instead of the first connector, enabling shared use of the casing by a semiconductor memory device including the first connector and another semiconductor memory device including the second connector. By the shared use of the casing, for example, it is made possible to reduce mold manufacturing costs, the designing and evaluation period of the casing, and the setup period of the manufacturing facilities, thereby enabling cost reduction of the semiconductor memory device.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device comprising:
   a casing including a first edge that forms a first opening that opens to outside and allows a first connector to pass through and be held by the first edge, the first connector conforming to USB Type-A standard;
   a substrate housed in the casing;
   a first electronic component mounted on the substrate, the first electronic component that stores therein information;
   a second electronic component mounted on the substrate, the second electronic component that controls the first electronic component;
   a second connector mounted on the substrate, the second connector that passes through the first opening away from at least a part of the first edge; and
   an interposition member that is interposed between an inner surface of the casing and the second connector, is held by the inner surface, and holds the second connector.

2. The semiconductor memory device according to claim 1, wherein
   the casing is made of metal,
   the interposition member is made of metal, and
   the second connector includes a shell electrically connected to the casing via the interposition member.

3. The semiconductor memory device according to claim 1, wherein
   the interposition member includes a second edge that forms a second opening, and the second connector passes through the second opening so as to be held by the second edge.

4. The semiconductor memory device according to claim 3, wherein the second connector, while mounted on the substrate, can be inserted through the second opening detachably.

5. The semiconductor memory device according to claim 4, wherein
the second connector extends from the substrate in a first direction,
the interposition member includes a first restrictor and a second restrictor, the first restrictor that faces an end of the second connector in a second direction opposite to the first direction to restrict movement of the second connector with respect to the interposition member in the second direction, the second restrictor that faces an end of the substrate in the first direction to restrict movement of the substrate with respect to the interposition member in the first direction, and
the first restrictor elastically deforms to move away from an end of the second connector, and allows movement of the second connector with respect to the interposition member in the second direction.

6. The semiconductor memory device according to claim 5, wherein
the substrate includes a first surface on which the first electronic component is mounted, and a second surface opposite the first surface, and
the interposition member includes a third restrictor and a fourth restrictor, the third restrictor that faces the first surface to restrict movement of the substrate with respect to the interposition member in a direction in which the first surface faces, the fourth restrictor that faces the second surface to restrict movement of the substrate with respect to the interposition member in a direction in which the second surface faces.

7. The semiconductor memory device according to claim 6, wherein
the substrate is provided with a cutout, and
the casing includes a fifth restrictor which is at least partially housed in the cutout, and faces an edge of the cutout to restrict movement of the substrate in the first direction and the second direction.

8. The semiconductor memory device according to claim 3, wherein
the casing includes an end face to which the first opening is open,
the interposition member includes an outer surface to which the second opening is open, and
the outer surface and the end face are located on the same plane.

9. The semiconductor memory device according to claim 1, wherein
the inner surface includes the first edge, and
the interposition member is interposed between the first edge and the second connector and is held by the first edge.

10. The semiconductor memory device according to claim 1, wherein the second connector conforms to USB Type-C standard.

11. The semiconductor memory device according to claim 10, wherein
the inner surface includes the first edge, and
the interposition member is interposed between the first edge and the second connector and is held by the first edge.

12. The semiconductor memory device according to claim 10, wherein
the interposition member includes a second edge that forms a second opening, and
the second connector passes through the second opening so as to be held by the second edge.

13. The semiconductor memory device according to claim 12, wherein the second connector, while mounted on the substrate, can be inserted through the second opening detachably.

14. The semiconductor memory device according to claim 13, wherein
the second connector extends from the substrate in a first direction,
the interposition member includes a first restrictor and a second restrictor, the first restrictor that faces an end of the second connector in a second direction opposite to the first direction to restrict movement of the second connector with respect to the interposition member in the second direction, the second restrictor that faces an end of the substrate in the first direction to restrict movement of the substrate with respect to the interposition member in the first direction, and
the first restrictor elastically deforms to move away from an end of the second connector, and allows movement of the second connector with respect to the interposition member in the second direction.

15. The semiconductor memory device according to claim 14, wherein
the substrate includes a first surface on which the first electronic component is mounted, and a second surface opposite the first surface, and
the interposition member includes a third restrictor and a fourth restrictor, the third restrictor that faces the first surface to restrict movement of the substrate with respect to the interposition member in a direction in which the first surface faces, the fourth restrictor that faces the second surface to restrict movement of the substrate with respect to the interposition member in a direction in which the second surface faces.

16. The semiconductor memory device according to claim 15, wherein
the substrate is provided with a cutout, and
the casing includes a fifth restrictor which is at least partially housed in the cutout, and faces an edge of the cutout to restrict movement of the substrate in the first direction and the second direction.

17. The semiconductor memory device according to claim 12, wherein
the casing includes an end face to which the first opening is open,
the interposition member includes an outer surface to which the second opening is open, and
the outer surface and the end face are located on the same plane.

18. The semiconductor memory device according to claim 10, wherein
the casing is made of metal,
the interposition member is made of metal, and
the second connector includes a shell electrically connected to the casing via the interposition member.

* * * * *